United States Patent
Hsieh et al.

(10) Patent No.: US 9,959,372 B2
(45) Date of Patent: May 1, 2018

(54) BUILDING INFORMATION MODELING FEEDBACK SYSTEM, METHOD, AND COMPUTER READABLE MEDIUM

(71) Applicant: NATIONAL TAIWAN UNIVERSITY, Taipei (TW)

(72) Inventors: Shang-Hsien Hsieh, Taipei (TW); Huan-Ting Chen, Kaohsiung (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 747 days.

(21) Appl. No.: 14/504,703

(22) Filed: Oct. 2, 2014

(65) Prior Publication Data

US 2015/0278402 A1    Oct. 1, 2015

(30) Foreign Application Priority Data

Mar. 31, 2014   (TW) .............. 103111935 A

(51) Int. Cl.
  *G06F 17/50* (2006.01)
(52) U.S. Cl.
  CPC ................ *G06F 17/5004* (2013.01)
(58) Field of Classification Search
  None
  See application file for complete search history.

(56) References Cited

U.S. PATENT DOCUMENTS

2012/0066178 A1*  3/2012  Omansky ............ G06F 17/5004
                                              707/626
2012/0310906 A1   12/2012 Miller et al.
2013/0218924 A1*  8/2013  Kim .................. G06F 17/30569
                                              707/770

FOREIGN PATENT DOCUMENTS

TW        201344468 A     11/2013
TW        201409385 A     3/2014

OTHER PUBLICATIONS

Tien-Hsiang Chuang, et al., "Applying Cloud Computing Technology to BIM Visualization and Manipulation", Conference on Computer Applications in Civil and Hydraulic Engineering 2011 (CCACHE 2011), Sep. 1-2, 2011, Kaohsiung, Taiwan.

* cited by examiner

*Primary Examiner* — Syed Roni
(74) *Attorney, Agent, or Firm* — Li & Cai Intellectual Property (USA) Office

(57) ABSTRACT

A building information modeling (BIM) feedback system has at least one data system, a model presentation server system, a user device, and an information feedback database management system (DBMS). The data system receives objects posted by the model manager and then retrieves information of a building model and object mapping information, wherein the object mapping information records the relation between object identifications and the retrieved objects. Via the user device, a user views the building model and manipulates to generate feedback information, wherein the feedback information has an object data structure having the object identification and the parameters associated with the object which has the parameters to be updated. Based on the object mapping information, the information feedback DBMS requests the corresponding data system to update the parameters of the corresponding object according to the feedback information.

7 Claims, 3 Drawing Sheets

BUILDING INFORMATION MODELING FEEDBACK SYSTEM, METHOD, AND COMPUTER READABLE MEDIUM

BACKGROUND

1. Technical Field

The present disclosure relates to a building information modeling (BIM) system, in particular to a BIM feedback system, method, and a computer readable medium, wherein the user, such as an architect, a designer, a contractor, a project manager, or an inspector can manipulate the BIM feedback system to generate the feedback information.

2. Description of Related Art

BIM is a new technology and tool for architecture, engineering, construction, and uses a building object model or a building engineering information model which contains sufficient information to support lifecycle building management and can be directly read and interpreted by the computer application program. In short, the BIM model can be seen as a three dimensional (3D) geometric modeling of building objects parameterized with non-geometrical attributes. In the BIM, information of the BIM model not only has the geometry, but also includes useful architectural and engineering data. The data are provided for the programming system as the sufficient calculation basis, and the program can automatically calculate the accurate information required by the user, such as an architect, a designer, a contractor, a project manager, or an inspector, according to the data of the components. The information herein can be shown by using different presentation manners, such as a ground floor plan, an elevation, a section view, a detail view, a 3D view, a perspective view, a material list of the building, calculated illumination effect of the daylight, required air quantity of the air condition, or required electric power consumption of the air condition in Winter and Summer associated with each room.

In the conventional BIM system, the user can retrieve the information of the BIM model through different manners, such as a spreadsheet, open database connectivity (ODBC), or an application programming interface (API), so as to perform analysis, design, construction, maintenance on the building. Currently, the BIM system adopts different file formats for the BIM model. Although there is an open standard like IFC (Industry Foundation Class) for interoperability of the BIM system, the demand of the information exchange cannot be easily satisfied especially when the BIM model is edited in a heterogeneous environment. The conventional BIM system merely allows user capable of manipulating the modeling tool to manage the information, but does not allow the user being unable to manipulate the modeling tool or lacking the capability to interoperate and input the feedback information into the BIM system to update, modify, or reproduce the BIM model in a heterogeneous environment.

On the other hand, the information of the BIM model has its lifecycle. That is, after design, construction, or maintenance of the building has been performed, the BIM model should be further updated, modified, or reproduced. Thus the demand of the user for BIM system is not merely limited to information acquisition, and the user hopes that the cooperative partners can feedback the information by using the BIM system to update, modify, or reproduce the BIM model.

SUMMARY

An exemplary embodiment of the present disclosure provides a BIM feedback system having at least one data system, a model presentation server system, a user device, and an information feedback database management system (DBMS). The data system receives objects posted by the model manager and then retrieves information of a building model and object mapping information, wherein the object mapping information records relation between object identifications and the retrieved objects. Via the user device, a user views the building model and manipulates to generate feedback information, wherein the feedback information comprises an object data structure having the object identification and parameters associated with the object which has at least one parameter to be updated. Based on the object mapping information, the information feedback DBMS requests the corresponding data system to update at least one of the parameters of the corresponding object according to the feedback information.

An exemplary embodiment of the present disclosure provides a feedback method executed in the BIM feedback system, and steps of the BIM feedback method are illustrated as follows. Multiple objects are obtained and analyzed, and object mapping information is created, wherein the object mapping information records relation between the identifications of the BIM model objects and the obtained objects. After feedback information is received, and based on the object mapping information, the corresponding object is requested to be updated according to the feedback information.

An exemplary embodiment of the present disclosure provides computer readable medium recording at least one segment of codes, and the BIM feedback system reads the codes to execute the above BIM feedback method.

To sum up, the BIM feedback system and method can allow the user to manipulate to generate the feedback information, so as to update the object, and that is, the BIM feedback system and method can satisfy with the interoperability of information exchange demand in a heterogeneous environment instead of using a modeling tool only.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
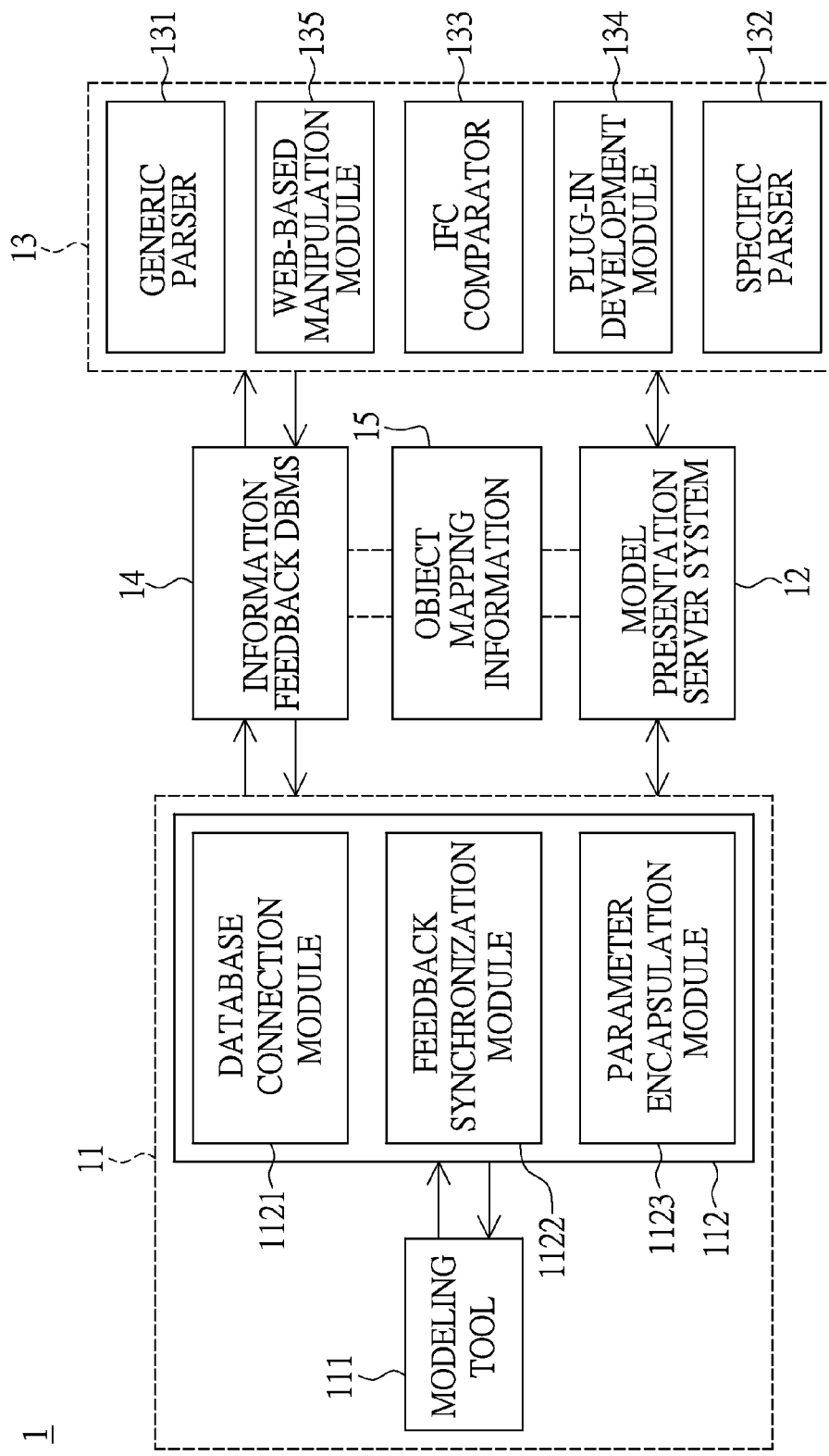
FIG. 1 is a block diagram showing a BIM feedback system according to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Since the modeling tools for BIM designing adopt different formats and standards, the interoperability cannot satisfy with the information exchange demand. The conventional BIM system mostly provides different objects for the user, and retrieves only portion of information associated with the building model according to the objects obtained by the user. Then, the building model is presented to the user to view and observe by using a specific manner. The conventional BIM system cannot allow the user being unable to manipulate the modeling tool or lacking the capability to interoperate and input the feedback information into the BIM system to update at least one parameter of the object. To update the object, the user must request the model manager to manipulate the modeling tool of the data system, or manipulate the modeling tool of the data system by himself.

To let the user (particularly the user being unable to manipulate the modeling tool or lacking the capability) feasibly update at least one parameter of the object by using the feedback information, exemplary embodiments of the present disclosure provide BIM feedback system and method. When the user views the building model, the user can manipulate to generate the feedback information, so as to update at least one parameter of the object. In addition, for the above BIM feedback method, an exemplary embodiment of the present disclosure provides computer readable medium recording at least one segment of codes, and the BIM feedback system reads the codes to execute the above BIM feedback method.

As mentioned above, the different objects represent different functions of building elements, and thus the BIM feedback system and method analyze the objects to acquire parameters of the objects, and then retrieve the information of the building model according to the objects. When the BIM feedback system and the method obtains the objects, the BIM feedback system and method assign an object identification to each of the objects, so as to generate the object mapping information, and that is, the object mapping information records the relation between the objects and the object identifications. Thus, the feedback information in the BIM feedback system and method can have an object data structure, wherein the object data structure comprises object identifications and parameters of the objects. Based on the object mapping information, the BIM feedback system can indicate the data system to update at least one of the parameters of the corresponding object according to the feedback information.

The details of the BIM feedback system and method according to exemplary embodiment of the present disclosure are illustrated as follows.

Referring to FIG. 1, FIG. 1 is a block diagram showing a BIM feedback system according to an exemplary embodiment of the present disclosure. The BIM feedback system 1 comprises at least one data system 11, a model presentation server system 12, a user device 13, and an information feedback DBMS system 14, wherein the model presentation server system 12 is wirelessly or wiredly linked between the data system 11 and the user device 13, the information feedback DBMS 14 is also wirelessly or wiredly linked between the data system 11 and the user device 13, and the information feedback DBMS 14 and the model presentation server system 12 are wirelessly or wiredly linked to each other.

The data system 11 stores at least one BIM, and the BIM is constructed by at least one object. The data system 11 provides the objects to the model manager, wherein the objects have the different functions. The model presentation server system 12 can receive the manipulation which the model manager manipulates the modeling tool 111, so as to request the user device 13 to advise the feedback information. Next, the modeling API 112 of the data system 11 analyzes the objects to retrieve the parameters of the objects, and thus generates information of the corresponding building model to the information feedback DBMS 14 according to the retrieved objects. The model presentation server system 12 presents the viewable building model and relative information for the user device 13 according to the object mapping information. Thus, the user at the client end can check or view the building model through the user device 13. In the exemplary embodiment of the present disclosure, the model presentation server system 12 can be for example an industry foundation classes (IFC) based web server, and the present disclosure does not limit the type of the model presentation server system 12.

It is noted that, after the modeling API 112 analyzes the objects, the modeling API 112 assigns object identifications to the objects, wherein the assigned object identifications of the different objects are different. Then, the modeling API 112 correspondingly generates the object mapping information 15 to the information feedback DBMS 14, wherein object mapping information 15 records the relation between the object identifications and the objects.

The user can manipulate the user device 13 to generate the feedback information to the information feedback DBMS 14, wherein the feedback information comprises the parameters and object identification of the object which has at least one parameter to be modified. The information feedback DBMS 14 receives and stores the feedback information, and can be a database for storing information by using a non-relational manner, such as not only SQL (NoSQL) database, so as to store the object data structure of the feedback information. Furthermore, the feedback DBMS 14 also stores retrieved objects. However, the present disclosure does not limit the type of the information feedback DBMS 14. Based on the object mapping information 15, the information feedback DBMS 14 can recognize that the object identification of the feedback information corresponds to which one of the objects. The information feedback DBMS 14 can further generate the update request to the data system 11 according to the stored feedback information, so as to request the data system 11 to update at least one of the parameters of the corresponding object.

By the way, after the data system 11 updates at least one of the parameters of the corresponding object, the data system 11 can send information which indicates the update is successfully performed to the user device 13 through the information feedback DBMS 14. Thus, through the user device 13, the user at the client end can request the data system 11 to retrieve the information of the updated building model according to updated objects.

For example, the building model can be constructed by a reinforced concrete object, a steel object, and a pipe object. The model presentation server system 12 demonstrates the above objects from the data system 11 to generate the information of the building model, and presents the building model to the user at the client end to view or observe by using a specific presentation manner. The user at the client end can obtain the information of the building model through the user device 13, and manipulate the user device 13 to generate the feedback information to the information feedback DBMS 14 after viewing or observing the building model.

After modeling API 112 analyzes the reinforced concrete object, the steel object, and the pipe object, the modeling API 112 assigns the object identifications REINFORCED_CONCRETE_001, STEEL_ALLOCATION_001, and PIPE_ALLOCATION_001 to these objects, and correspondingly generates the object mapping information 15 to the information feedback DBMS 14. If the user wants to update parameters of the pipe object after viewing the building model through the user device 13, the user can manipulate the user device 13 to generate the feedback information comprising the object data structure having the object identification PIPE_ALLOCATION_001 and the parameters of the pipe object to the information feedback DBMS 14. It is noted that the object identifications of these objects can be coded by randomly giving English words and numeric numbers, and the present disclosure does not coding manner of the object identifications.

Based on the object mapping information 15, the information feedback DBMS 14 can recognize that the feedback information is used to generate the update request for requesting the data system 11 to update at least one of the parameters of the stored pipe object. Next, if the data system 11 agrees with the update request automatically or manually through the instruction of the model manager, the data system 11 updates the stored pipe object according to the feedback information.

Though the information feedback DBMS 14 can request the data system 11 to update the object, the model manager at the end of the data system 11 may deny the update request, and object of the data system 11 cannot be updated. In short, the event can be triggered by the model manager at the end of the data system 11 actively to request the user at the client end to provide modification suggestion, i.e. the data system 11 is an active role, and the user device 13 is a passive role.

One implementation of the data system 11 in the exemplary embodiment of the present disclosure can be implemented as follows, and the present disclosure does not limit the implementation of the data system 11.

The data system 11 can comprise the modeling tool 111 and the modeling API 112, wherein the modeling tool 111 is electrically connected to the modeling API 112. The modeling API 112 can comprises a database connection module 1121, a feedback synchronization module 1122, and a parameter encapsulation module 1123.

The modeling tool 111 can generate or modify the objects. The modeling tool 111 is Revit modeling tool for example, and the present disclosure does not limit the type of the modeling tool 111. The database connection module 1121 manages the connection between the data system 11 and the information feedback DBMS 14, so as to allow the information feedback DBMS 14 to access the objects. The database connection module 1121 is for example a web service API, and the present disclosure does not limit the type of the database connection module 1121. The feedback synchronization module 1122 receives the update request corresponding to the feedback information, and analyzes the update request to modify or update the parameters. The feedback synchronization module 1122 can be an API of the modeling tool 111 for example, and the present disclosure does not limit the type of the feedback synchronization module 1122. The parameter encapsulation module 1123 encapsulates parameters, so to provide the encapsulated parameters for the information feedback DBMS 14 and the model presentation server system 12 or transmit the parameters to be updated in the feedback information to the modeling tool 111. The parameter encapsulation module 1123 is for example a parameter encapsulation module using a schema-free data structure, and the present disclosure does not limit the type of the parameter encapsulation module 1123.

One implementation of the user device 13 in the exemplary embodiment of the present disclosure can be implemented as follows, and the present disclosure does not limit the implementation of the user device 13.

The user device 13 comprises a generic parser 131, a specific parser 132, an IFC comparator 133, a plug-in development module 134 and a web-based manipulation module 135. The generic parser 131 performs a generic parsing analysis on the feedback information to generate a generic parsing analysis result, such that the feedback information of unknown format can be presented in the building model to the user at the client end. The specific parser 132 performs a specific parsing analysis on the feedback information to generate a specific parsing analysis result, such that the feedback information of an open standard format can be presented in the building model to the user at the client end, wherein the specific parser can conform to an open standard. The IFC comparator 133 can analyze the feedback information of IFC, such that the feedback information of IFC can be presented in the building model to the user at the client end. The plug-in development module 134 has an API for integrating other softwares, so as to process the feedback information generated by the other softwares, and present the feedback information in the building model to the user at the client end. The web-based manipulation module 135 generates a web page according to the information of the building model to the user, and the web page has the browsing and viewing function, such that the user can view and manipulate the building model to generate the feedback information through the web page. In short, the user device 13 not only lets the user at the client end manipulate to generate the feedback information, but also presents the feedback information in the building model to the user at the client end.

Figure 2:
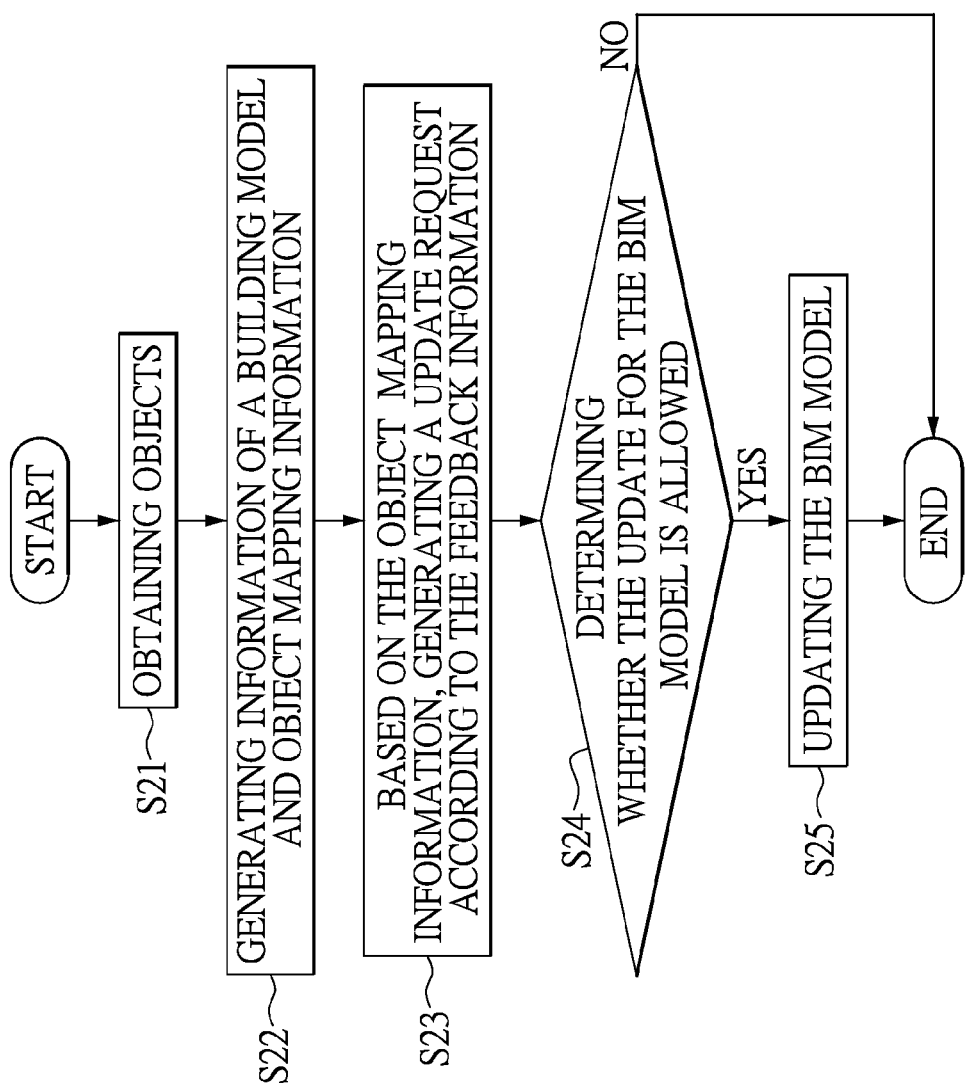
FIG. 2 is a flow chart of a BIM feedback method according to an exemplary embodiment of the present disclosure.

Referring to FIG. 1 and FIG. 2, FIG. 2 is a flow chart of a BIM feedback method according to an exemplary embodiment of the present disclosure. The BIM feedback method can be executed in the BIM feedback system in FIG. 1. Each step of the BIM feedback method can be written down as a segment of codes to be recorded in the computer readable medium.

Firstly, at step S21, the modeling API 112 obtains the objects. Next, at step S22, the modeling API 112 analyzes the objects and generates information of the building model and object mapping information, wherein the information of the building model is used to let the user at the client end view and observe the building model through the user device 13, and the object mapping information records the relation between the object identifications and the objects.

Next, at step S23, the information feedback DBMS 14 receives and stores the feedback information from the user device 13, and based on the object mapping information, generates the update request to the data system according to the feedback information, so as to request the data system 11 to update at least one of the parameters of the corresponding object, wherein the feedback information comprises an object data structure, and the object data structure comprises the object identifications and the parameters.

Next, at step S24, the data system 11 receives the update request, and determines whether the stored object is allowed to be updated, wherein the data system 11 can update the stored object automatically or according to the decision of the model manager. If the data system 11 allows the stored object to be updated, steps S25 is executed. If the data system 11 does not allow the stored object to be updated, the BIM feedback method is terminated, and information indicating the update failure is sent to the user device 13 selectively. At step S25, the data system 11 updates at least one of the parameters of the object corresponding to the feedback information.

Figure 3:
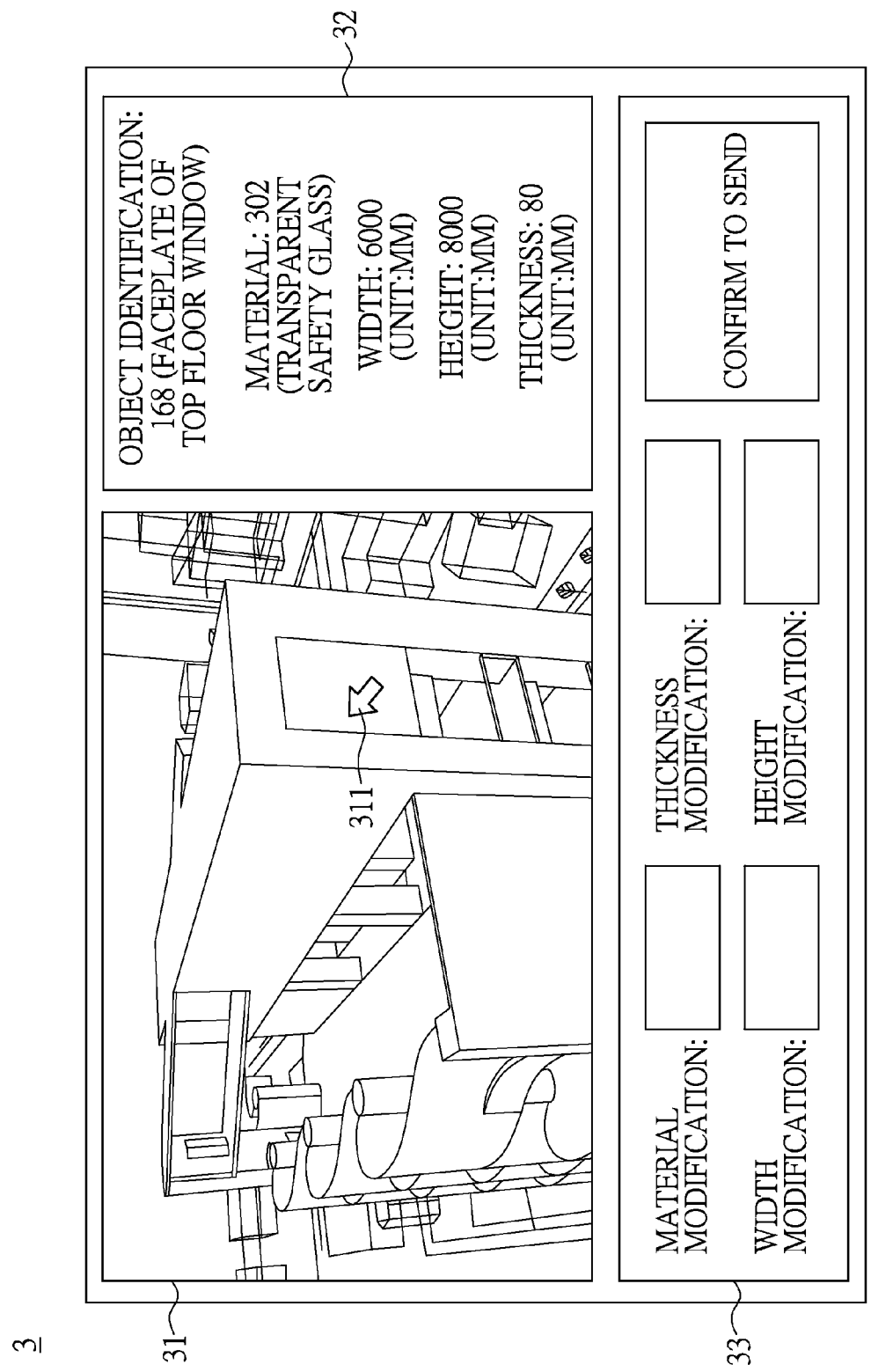
FIG. 3 is a schematic diagram showing a user interface of a BIM feedback system or method according to an exemplary embodiment of the present disclosure.

Referring to FIG. 3, FIG. 3 is a schematic diagram showing a user interface of a BIM feedback system or method according to an exemplary embodiment of the present disclosure. The user interface 3 comprises a building model view window 31, an information presentation window 32, and a feedback information rendering window 33. In the building model view window 31, the user can move the cursor 311 to select an object of the building model, and the object of faceplate associated with the top floor window is selected in the exemplary embodiment.

The information presentation window 32 presents the object identification and the parameters of the selected object, and can further provide the additional information (such as the explanations in the brackets shown in the information presentation window 32). In the exemplary embodiment, the object identification and the parameters (such as material, width, height, and thickness) of the faceplate of the top floor window are presented.

The feedback information rendering window 33 is provided for the user to manipulate to generate the feedback information. For example, the user can type the values of the parameters (such as material, width, height, and thickness) of the object associated with the faceplate of the top floor window to be modified or updated, and after the parameters to be modified or updated have been typed, the user at the client end can click the button indicating "confirm to send" to generate the feedback information. By the way, the feedback information rendering window 33 is designed in the manner that the user merely types the parameters to be modified or updated, and the values of other non-typed parameters are permitted to be original values. In addition, the user interface 3 is not used to limit the present disclosure, and for example, the feedback information rendering window 33 in the user interface 3 can be designed to have checking boxes indicating "remain unchanged" near the side the fields of the parameters.

Accordingly, the BIM feedback system and method provided by the exemplary embodiments of the present disclosure allow the user to manipulate to generate the feedback information to update the object. Furthermore, by using the object mapping information, the feedback information can merely comprise an object data structure having parameters and object identifications, such that traffic amount of transmission associated with the feedback information can be decreased. Moreover, the user can update the objects with different data structures without understanding the data structure of the objects, and thus convenience of user operation is increased.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A building information modeling (BIM) feedback system, comprising:
    at least one data system, storing a plurality of objects, obtaining at least a portion of the objects, retrieving information of a building model and object mapping information, wherein the object mapping information records relation between object identifications and retrieved objects;
    a model presentation server system, wirelessly or wiredly linking the data system and presenting a viewable building model and relative information for a user device according to the object mapping information;
    the user device, wirelessly or wiredly linking the model presentation server system and allowing a user to view the building model and manipulate to generate feedback information, wherein the feedback information comprises an object data structure having the object identification and parameters associated with the object which has at least one parameter of the parameters to be updated; and
    an information feedback database management system (DBMS), wirelessly or wiredly linking the user device, the data system, and the model presentation server system and receiving the object mapping information and storing the retrieved objects and the feedback information from the user device, based on the object mapping information, requesting the corresponding data system to update at least one of the parameters of the corresponding object according to the feedback information;
    wherein after the data system updates at least one of the parameters of the corresponding object, the user device requests the data system to generate information of the updated building model;
    wherein based on the object mapping information, the feedback information DBMS generates a update request to the data system according to the feedback information, and when the data system allows the corresponding object to be updated, the data system updates at least one of the parameters of the corresponding object and send an information which indicates the update is successfully performed to the user device through the information feedback DBMS;
    wherein the user device generates a web page according to the information of the building model to the user, and the web page has browsing and viewing function, such that the user views and manipulates the building model to generate the feedback information through the web page.

2. The BIM feedback system according to claim 1, wherein the feedback information DBMS is a database for storing information by using a non-relational manner.

3. The BIM feedback system according to claim 1, wherein a modeling application programming interface (API) of the data system analyzes the retrieved objects to obtain the parameters of the objects, and assigns the object identifications to the objects, wherein different objects have the different object identifications.

4. The BIM feedback system according to claim 1, wherein the model presentation server system is an industry foundation classes (IFC) based web server.

5. The BIM feedback system according to claim 1, wherein the data system determines whether at least one of the parameters associated with the corresponding object is allowed to be updated automatically or by using a decision of a model manager.

6. A building information modeling (BIM) feedback method including at least one data system, a model presentation server system, a user device, and an information feedback database management system (DBMS), wherein the model presentation server system is wirelessly or wiredly linked between the data system and the user device, the information feedback DBMS is also wirelessly or wiredly linked between the data system and the user device, and the information feedback DBMS and the model presentation server system are wirelessly or wiredly linked to each other, the method executed in a BIM feedback system, comprising:
  obtaining objects by using a modeling application programming interface (API) of the data system;
  analyzing the objects by using the modeling API, and retrieving information of a building model and object mapping information, wherein the object mapping information records relation between object identifications and retrieved objects;
  receiving feedback information by using the information feedback DBMS, and based on the object mapping information, requesting the data system to update the corresponding object according to the feedback information;
  generating information of the updated building model by the data system requested by the user device;
  determining whether the corresponding object is allowed to be updated by using the data system; and
  if the corresponding object is allowed to be updated, updating the corresponding object and sending an information which indicates the update is successfully performed to the user device through the information feedback DBMS by using the data system;
  wherein based on the object mapping information, the feedback information DBMS generates a update request to the data system according to the feedback information, and when the data system allows the corresponding object to be updated, the data system updates at least one of the parameters of the corresponding object and send an information which indicates the update is successfully performed to the user device through the information feedback DBMS;
  wherein the user device generates a web page according to the information of the building model to the user, and the web page has browsing and viewing function, such that the user views and manipulates the building model to generate the feedback information through the web page.

7. A non-transitory computer readable storage medium having stored thereon computer instructions for building information modeling (BIM) feedback method, including at least one data system, a model presentation server system, a user device, and an information feedback database management system (DBMS), wherein the model presentation server system is wirelessly or wiredly linked between the data system and the user device, the information feedback DBMS is also wirelessly or wiredly linked between the data system and the user device, and the information feedback DBMS and the model presentation server system are wirelessly or wiredly linked to each other, wherein the computer instructions when executed by a processor, causes the processor to: obtain objects by using a modeling application programming interface (API) of the data system; analyze the objects by using the modeling API, and retrieve information of a building model and object mapping information, wherein the object mapping information records relation between object identifications and retrieved objects; receive feedback information by using information the feedback database management system (DBMS), and based on the object mapping information, request the data system to update the corresponding object according to the feedback information; generate information of the updated building model by the data system requested by the user device; determine whether the corresponding object is allowed to be updated by using the data system; and if the corresponding object is allowed to be updated, update the corresponding object and send an information which indicate the update is successfully performed to a user device though the information feedback DBMS by using the data system, wherein based on the object mapping information, the feedback information DBMS generates a update request to the data system according to the feedback information, and when the data system allows the corresponding object to be updated, the data system updates at least one of the parameters of the corresponding object, and send an information which indicates the update is successfully performed to the user device through the information feedback DBMS, wherein the user device generates a web page according to the information of the building model to the user, and the web page has browsing and viewing function, such that the user views and manipulates the building model to generate the feedback information though the web page.

* * * * *